United States Patent [19]

Clecak et al.

[11] 4,397,937

[45] Aug. 9, 1983

[54] POSITIVE RESIST COMPOSITIONS

[75] Inventors: Nicholas J. Clecak; Dennis R. McKean; Robert D. Miller, all of San Jose; Terry C. Tompkins, Los Altos; Robert J. Twieg; Carlton G. Willson, both of San Jose, all of Calif.

[73] Assignee: International Business Machines Corporation, Armonk, N.Y.

[21] Appl. No.: 347,658

[22] Filed: Feb. 10, 1982

[51] Int. Cl.³ .......................... G03C 1/54; G03C 1/60
[52] U.S. Cl. .................................... 430/192; 430/193; 430/326; 260/141
[58] Field of Search ............... 430/192, 190, 193, 326; 260/141 D

[56] References Cited

U.S. PATENT DOCUMENTS

| | | | |
|---|---|---|---|
| 2,767,092 | 10/1956 | Schmidt | 95/7 |
| 3,666,473 | 5/1972 | Colom et al. | 430/192 |
| 3,823,130 | 7/1974 | Deutsch et al. | 260/141 |
| 4,005,437 | 1/1977 | Ross et al. | 430/192 |
| 4,123,279 | 10/1978 | Kobayashi | 430/192 |
| 4,308,368 | 12/1981 | Kubo et al. | 430/190 |

OTHER PUBLICATIONS

Grant, Julius, "Hockh's Chemical Dictionary", 4th Ed., 1969, pp. 295, 296, 361 and 637.
Gilman, Henry, "Organic Chemistry", 2nd Ed., 1953, pp. 229 and 244–245.

*Primary Examiner*—Charles L. Bowers, Jr.
*Attorney, Agent, or Firm*—Joseph G. Walsh

[57] ABSTRACT

Positive resists are formed from a soluble phenolic resin and a sensitizer which is a diester of a 1-oxo-2-diazonaphthalene sulfonic acid and of an unsymmetrical primary or secondary aliphatic diol which is a mixture of geometric and diastereoisomers.

12 Claims, No Drawings

POSITIVE RESIST COMPOSITIONS

TECHNICAL FIELD

The present invention is concerned with compositions useful for forming positive resist images.

BACKGROUND ART

U.S. Pat. No. 2,767,092 shows a diester of 1-oxo-2-diazo-5-naphthalene sulfonic acid with a symmetrical secondary aliphatic diol to be used as a light sensitizer in lithography.

U.S. Pat. No. 3,823,130 shows esters of the above-mentioned sulfonic acid with aliphatic monohydroxy alcohols. These materials are to be used as light sensitizers in lithography.

The use of esters of the above acid with aromatic diols is also known in the prior art. The prior art, however, does not show the use of the particular esters which characterize the present invention.

DISCLOSURE OF THE INVENTION

According to the present invention, positive resists are made using as the sensitizer a biester of 1-oxo-2-diazonaphthalene sulfonic acid and of an unsymmetrical primary or secondary aliphatic diol which is a mixture of geometric and diastereoisomers. The sensitizer is distributed in a phenolic resin which is transparent to the radiation being used. The resin containing the sensitizer is coated as a thin film on a base. It is then baked under controlled conditions and exposed to radiation in imagewise configuration. The portions of the film on which the radiation falls suffer degradation and are selectively removed by treatment with an alkaline developer.

The compositions employed in the present invention have several distinct and unpredictable advantages over the prior art. First of all, whereas the commonly employed aromatic phenolic esters are adequately sensitive only to visible and near UV light (365-450 nm), the esters of the present invention are particularly sensitive to ultraviolet light, especially ultra violet light in the mid ultraviolet range (300-335 nm). It is still an additional advantage of the present invention that the sensitizing material may be present in a much higher concentration than has previously been obtained. This makes possible higher loading, greater optical densities and consequently, higher sensitivity. For the purposes of this invention the use of unsymmetrical diols which are mixtures of geometric and diastereoisomers is critical. The high solubility of the bissulfonates derived from these compounds is the direct result of using such mixtures. The importance of limiting the invention to such unsymmetrical diols is demonstrated by comparing the compounds comprising this invention with the symmetrical diol derivative disclosed in the prior art. While the former are soluble in common organic solvents such as diglyme in all proportions, the latter is so sparingly soluble as to render it of no practical value. Furthermore, the esters employed in the present invention yield photoproducts that are transparent in the mid UV and therefore have superior bleachability. Consequently, better profile control is obtained.

In the present invention the most preferred sensitizers are 4,8-bis(6-diazo-5,6-dihydro-5-oxo-1-naphthalene sulfonyl oxymethyl) tricyclo [5.2.1.0$^{2,6}$] decane (Compound I), 4,8-Bis (6-diazo-5,6-dihydro-5-oxo-1-naphthalene sulfonyl oxyeth-1'-yl) tricyclo [5.2.1.0$^{2,6}$] decane (Compound II), and 4(8)-(3-diazo-3,4-dihydro-4-oxo-1-naphthalene sulfonyl oxymethyl)-8(4)-(6-diazo-5,6-dihydro-5-oxo-1-naphthalene sulfonyl oxymethyl) tricyclo [5.2.1.0$^{2,6}$] decane (Compounds III and IV).

The host resin is a soluble phenolic resin which is transparent to the radiation to be employed. Especially useful are phenol-formaldehyde type resins and poly(p-hydroxystyrenes). Resoles may be used, but novolak resins and poly(p-hydroxystyrenes) are preferred. The most preferred resin is a cresylic acid-formaldehyde resin.

The compositions of the present invention are particularly useful and advantageous when used with mid ultraviolet light (300-335 nm) exposure. They are, however, also useful with near ultraviolet light, and visible light (365-450 nm), with X-rays, and with electron beam irradiation.

It should be noted that in carrying out the present invention, it is possible to use mixtures of sensitizers. The use of mixtures has the advantage of making higher concentrations of sensitizer possible and allows adjustments of the absorption spectrum of the composition such that it can be matched to the exposure tool output thereby optimizing sensitivity. While reference above has been made to diazonaphthaquinone having the sulfonic acid group in the 5 position, it should be noted that esters of the material having the group in the 4 position may be used. Furthermore, mixed esters may also be used, i.e. esters which are diols esterified at one end with a molecule of the diazonaphthoquinone having the acid group in the 5 position and at the other end with a molecule of the diazonaphthoquinone having the sulfonyl group in the 4 position.

One of the main unexpected advantages of the present invention is that it makes it possible to employ a greater amount of bissulfonate sensitizer than had been possible in the past. In the past, the bissulfonate sensitizer has usually been present in the resin at about 0.15 molal concentration, with an upper limit of 0.25 molal due to solubility limitations. This is in sharp contrast to the present invention where the amount of sensitizer used ranges from 0.05 to 0.95 molal. The preferred concentration range is from 0.15 to 0.65 molal.

Still another distinction between the present invention and the prior art is the procedure used to bake the film of resin containing sensitizers on the substrate. In the prior art it has been common to employ a temperature of about 95° C. to 100° C. for five to 20 minutes to achieve optimum performance. With the materials of the present invention, it is recommended that the baking temperature be at 80° C. and that it be carried out for 10-30 minutes in order to achieve maximum performance.

BEST MODE FOR CARRYING OUT THE INVENTION

The following synthetic procedure describes the preferred method for making the preferred sensitizers and their precursors. Other diesters suitable for use in the present invention may be made by analogous methods. The following procedure also describes the preferred process for using the present invention.

Preparation of 4,8-Bis(6-diazo-5,6-dihydro-5-oxo-1-naphthalene sulfonyl oxymethyl) tricyclo [5.2.1.0$^{2,6}$]decane (Compound I)

To a solution of 35.4 g of tricyclo [5.2.1.0$^{2,6}$] decane-4,8-dimethanol, 4.4 g 4-dimethylaminopyridine, 87 ml triethylamine and 450 ml of methylene chloride was added a solution of 150 g 6-diazo-5,6-dihydro-5-oxo-1-naphthalenesulfonyl chloride in 1350 ml methylene chloride over a period of 1 hour. After 15 minutes of additional stirring the solution was washed with 1 l of 10% potassium bicarbonate solution, two 500 ml portions of 6 N hydrochloric acid solution, 1 l of water and 500 ml of saturated sodium bicarbonate solution. The methylene chloride solution was then dried over magnesium sulfate and the solvent was removed at reduced pressure to give 108.9 g of product.

Preparation of 4,8-Bis (6-diazo-5,6-dihydro-5-oxo-1-naphthalene sulfonyl oxyeth-1'-yl) tricyclo[5.2.1.0$^{2,6}$] decane (Compound II)

Part A: Preparation of Tricyclo[5.2.1.0$^{2,6}$] decane-4,8-dialdehyde

A solution of 3.92 g tricyclo [5.2.1.0$^{2,6}$] decane-4,8-dimethanol and 40 ml methylene chloride was added to 12.92 g of pyridinium chlorochromate in 50 ml methylene chloride. The mixture was stirred 2.5 hours at 25° C. and then diluted with 100 ml ether and filtered. The solid residue was washed with 25 ml of ether and then the combined filtrate was poured through a 6-inch column of Florisil. The solvent was removed at reduced pressure and the residue bulb-to-bulb distilled at 0.06 mm to yield 2.0 g of product.

Part B: Preparation of 4,8-Bis(hydroxyeth-1'-yl) tricyclo [5.2.1.0$^{2,6}$] decane To a solution of 1.5 g tricyclo [5.2.1.0$^{2,6}$] decane-4,8-dialdehyde and 25 ml of tetrahydrofuran at −78° C. was added 20 ml of a 1.4 M solution of methyllithium in ether. The reaction mixture was allowed to warm to 25° C. overnight and then diluted with 150 ml of ether. The ethereal phase was washed with 25 ml of H$_2$O and 25 ml of saturated sodium chloride solution and then dried over magnesium sulfate. Solvent removal gave 1.86 g of product.

Part C: Preparation of 4,8-Bis(6-diazo-5,6-dihydro-5-oxo-1-naphthalene sulfonyl oxyeth-1'-yl) tricyclo [5.2.1.0$^{2,6}$] decane To a solution of 1.86 g 4,8-Bis(hydroxyeth-1'-yl)tricyclo [5.2.1.0$^{2,6}$] decane, 0.93 g of 4-di-methylamino-pyridine, 4.7 ml of triethylamine and 30 ml of CH$_2$Cl$_2$ at 0° C. was added a solution of 7.8 g of 6-diazo-5,6-dihydro-5-oxo-1-naphthalene sulfonyl chloride and 80 ml of methylene chloride over 0.5 hr. The mixture was stirred ½ hour at 9° C. and 6 hours at 25° C. and then diluted with 100 ml of methylene chloride. The mixture was then filtered and the methylene chloride phase washed with 100 ml of 10% sodium bicarbonate solution, 100 ml of water, 100 ml of 2 N sulfuric acid solution 50 ml of 5% sodium bicarbonate solution and 50 ml of water. The solution was then dried over sodium sulfate and the solvent removed at reduced pressure to give 3.5 g of product.

Resist Formulation

The composition of the present invention may be varied depending upon the particular application desired. In general, the sensitizer is present as approximately 0.15 to 0.65 molal with respect to the resin. Casting solvents suitable for use in the present invention include, for example, such conventional solvents as diglyme, methyl isobutylketone, ethyl cellosolve acetate and the like and mixtures of these.

Numerous formulations were prepared in order to illustrate the improved speed and spectral response of the novel photoresist compositions of the invention.

A typical resist formulation was made from 0.70 grams of either Compound I or Compound II above and 2.78 grams of Varcum resin (Varcum is a trademark of Reichold Chem. Co. for its Cresol-formaldehyde Resin). The mixture of these ingredients was dissolved in 6.51 grams of diglyme. After filtration, the resist was spin-coated on silicon wafers to a thickness of 0.7–1.2 microns and prebaked at 80° C. for 30 minutes. The resist films were then subjected to lithographic evaluation as described below.

Thicker films may be used to a point beyond which the desired resolution is not obtained. For a 1.0 micron line width, a optimum resist thickness is about 1.0 micron for the formulation described above. Excellent image quality in thicker films requires appropriate adjustment of sensitizer loading.

Lithographic Evaluation

The optical sensitivity of the resists was measured in the mid UV (300–335 nm) and at conventional wavelengths (365–450 nm). The intensity measurements were made using an Optical Associates model 354 exposure monitor, equipped with probes calibrated for the desired wavelengths. These wavelengths were isolated using Oriel, mercury line, narrow band interference filters. The exposure tool used was a 1 KW Oriel photoresist exposure station equipped with a Xe-Hg lamp and cold mirror. Photoresist films were exposed at a fixed light intensity for various times and developed in an aqueous base such as 0.18 N KOH.

Experiments were carried out employing the combination of numerous photoresist formulations, light sources and E-beam to investigate conditions for 1–2 micron pattern imaging photolithographically. The resolution and pattern characteristics were evaluated by printing resolution mask patterns. The resist films were exposed to UV radiation through chromium masks on quartz substrates. In order to determine appropriate development conditions, solubility characteristics for resist films were examined in aqueous KOH developers by measuring film thickness loss as a function of dose and development time. Optimum composition and processing conditions were found to depend upon the exposure energy (wavelength), resist thickness and sensitizer loading. Examples of near optimum conditions for various applications are provided below.

EXAMPLES

CGA MANN 4800 Exposure Station (Conventional Wavelengths)

A 1.0 micron film of photoresist, 0.29 molal sensitizer, was exposed for 0.17 seconds per step and then developed in 0.22 N aqueous KOH. Excellent lithographic results were obtained. A 1:1 print of line/space/line and grating arrays was obtained at 9.25 minutes development for 1.0, 1.5 and 2.0 micron geometries with minimal line width variation.

Perkin Elmer 500 Exposure Station (Mid UV)

A 1.1 micron film of photoresist, 0.29 molal sensitizer, was exposed under the following conditions. Scan Speed 5000, aperture 0, using a Perkin Elmer DP6 filter. Excellent high contrast 1.0 micron isolated lines were defined upon development in 0.22 N aqueous KOH. This performance represents at least a two-fold increase in sensitivity over commercially available diazonaphthoquinone/novolak resists.

Perkin Elmer UV-3 Exposure Station (Mid UV)

Good operating conditions for this tool are UBK-7 filter, scan speed 225, 1 mm slits and aperture 2. A quartz mask with chrome patterns was used to project images down to 1 micrometer in dimension onto the photoresist coated silicon wafers.

The wafers were then developed in an aqueous alkaline developer comprising a mixture of Shipley AZ2401 developer diluted with 4 parts of deionized water for 250 seconds. The development was stopped by immersion in deionized water. Excellent pattern definition was achieved again showing at least 2× sensitivity improvement over commercial resists.

After patterning, the wafers, which are now covered with patterned photoresist, are either used directly, or subject to a photoresist hardening process before further use in semiconductor device manufacturing sequences.

E-Beam Exposure Measurements

Using a 20 KV, raster scan E-beam exposure station, a matrix study was conducted in which the percent of sensitizer in the resist formulation was varied while the exposure dose was held constant (10 micron coulombs/cm2). The sensitivity as defined by the ratio of unexposed development rate (Ro) to exposed development rate (R) of the resist formulations was determined by measuring the time required to develop exposed and unexposed regions. High R/Ro ratios, greater than 20, were obtained. This represents at least a 2× improvement in sensitivity over commercially available diazonaphthoquinonenovolak resists.

We claim:

1. A positive resist composition comprising a phenolic resin transparent to radiation used for imaging and a sensitizer, characterized in that the sensitizer is a bis-ester of a 1-oxo-2-diazonaphthalene sulfonic acid and of an unsymmetrical primary or secondary aliphatic diol which is a mixture of geometric and diasterioisomers, the sensitizer being present at a concentration of from 0.05 to 0.95 molal.

2. A composition as claimed in claim 1 wherein the phenolic resin is a novolak.

3. A composition as claimed in claim 2 wherein the novolak is formed from cresylic acid and formaldehyde.

4. A composition as claimed in claim 1 wherein the phenolic resin is poly(p-hydroxystyrene).

5. A composition as claimed in claim 1 wherein the sensitizer is present at a concentration of 0.15 to 0.65 molal.

6. A composition as claimed in claim 1 wherein the diazonaphthalene moiety is a 5 sulfonate.

7. A composition as claimed in claim 1 wherein the diazonaphthalene moiety is a 4 sulfonate.

8. A composition as claimed in claim 1 wherein one diazonaphthalene moiety is a 4 sulfonate and one moiety is a 5 sulfonate.

9. A composition as claimed in claim 1 wherein the sensitizer comprises a mixture of 4,4-bissulfonates, 4,5-bissulfonates and 5,5-bissulfonates.

10. A composition as claimed in claim 1 wherein the diol is tricyclo $[5.2.1.0^{2,6}]$ decane-4,8-dimethanol.

11. A composition as claimed in claim 1 wherein the diol is 4,8-bis(hydroxyeth-1-yl) tricyclo $[5.2.1.0^{2,6}]$ decane.

12. A composition as claimed in claim 1 wherein the sensitizer is 4,8-bis(6-diazo-5,6-dihydro-5-oxo-1-naphthalene sulfonyl oxymethyl)tricyclo $[5.2.1.0^{2,6}]$ decane.

* * * * *